(12) United States Patent
Lin et al.

(10) Patent No.: US 10,529,705 B2
(45) Date of Patent: Jan. 7, 2020

(54) INTEGRATED TRANSISTOR AND PROTECTION DIODE AND FABRICATION METHOD

(71) Applicant: TEXAS INSTRUMENTS INCORPORATED, Dallas, TX (US)

(72) Inventors: Haian Lin, Bethlehem, PA (US); Frank Baiocchi, Allentown, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/372,165

(22) Filed: Apr. 1, 2019

(65) Prior Publication Data

US 2019/0229110 A1    Jul. 25, 2019

Related U.S. Application Data

(62) Division of application No. 15/729,894, filed on Oct. 11, 2017, now Pat. No. 10,319,712.

(60) Provisional application No. 62/420,317, filed on Nov. 10, 2016.

(51) Int. Cl.
| | |
|---|---|
| *H01L 23/62* | (2006.01) |
| *H01L 27/02* | (2006.01) |
| *H01L 29/10* | (2006.01) |
| *H01L 29/66* | (2006.01) |
| *H01L 29/06* | (2006.01) |
| *H01L 29/417* | (2006.01) |
| *H01L 29/36* | (2006.01) |
| *H01L 29/861* | (2006.01) |
| *H01L 29/40* | (2006.01) |
| *H01L 29/78* | (2006.01) |

(52) U.S. Cl.
CPC ...... *H01L 27/0255* (2013.01); *H01L 29/0653* (2013.01); *H01L 29/1041* (2013.01); *H01L 29/1087* (2013.01); *H01L 29/1095* (2013.01); *H01L 29/36* (2013.01); *H01L 29/402* (2013.01); *H01L 29/4175* (2013.01); *H01L 29/41766* (2013.01); *H01L 29/66136* (2013.01); *H01L 29/66659* (2013.01); *H01L 29/7835* (2013.01); *H01L 29/8611* (2013.01); *H01L 29/1045* (2013.01)

(58) Field of Classification Search
CPC ............. H01L 27/0255; H01L 29/4175; H01L 29/0653; H01L 29/1041; H01L 29/1087; H01L 29/66136
See application file for complete search history.

(56) References Cited

U.S. PATENT DOCUMENTS

| | | | |
|---|---|---|---|
| 5,886,381 | A  | 3/1999  | Frisina |
| 6,365,932 | B1 | 4/2002  | Kouno |
| 8,283,727 | B1 | 10/2012 | Walker et al. |
| 8,288,820 | B2 | 10/2012 | Kocon et al. |

(Continued)

*Primary Examiner* — Robert G Bachner
(74) *Attorney, Agent, or Firm* — Rose Alyssa Keagy; Charles A. Brill; Frank D. Cimino

(57) ABSTRACT

Disclosed examples provide integrated circuits including a source down transistor with a gate, a body region, an n-type source region, an n-type drain region, a p-type body contact region below the n-type source region which extends to a first depth, along with a protection diode which includes an n-type cathode region, and a p-type anode region below the n-type cathode region, where the breakdown voltage of the protection diode is defined by adjusting the relative doping concentrations and/or the vertical locations of the p-type anode region with respect to the n-type cathode region.

9 Claims, 17 Drawing Sheets

(56) References Cited

U.S. PATENT DOCUMENTS

2011/0303976 A1 12/2011 Kocon et al.
2013/0146978 A1 6/2013 Mahalingam et al.
2014/0183622 A1 7/2014 Lin et al.
2015/0214222 A1 7/2015 Wang et al.
2017/0207335 A1 7/2017 Lin et al.

INTEGRATED TRANSISTOR AND PROTECTION DIODE AND FABRICATION METHOD

REFERENCE TO RELATED APPLICATION

This Divisional patent application claims priority to U.S. patent application Ser. No. 15/729,894, filed Oct. 11, 2017, that claims the benefit of priority of U.S. Provisional Patent Application No. 62/420,317, entitled "ESD DIODE INTEGRATED WITH SOURCE DOWN POWER MOSFET", filed on Nov. 10, 2016, the entirety of all is hereby incorporated by reference.

BACKGROUND

Synchronous buck voltage converters and other switching power supply circuits are used in portable computers, servers, telecommunication devices and various other applications. Source down silicon technology allows high-side die to be stacked on top of the low-side transistor to implement a synchronous buck converter topology in a very simple and cost-effective manner. Furthermore, this technology also facilitates integrating a pair of power MOSFET in a common source configuration for load switch applications. In many applications, electro-static discharge (ESD) protection is important. ESD protection circuits are used to protect power supply components by ESD event triggered clamp circuits or components to safely discharge a protected pad or node. ESD protection diodes can be used to protect the source down NMOS gate terminal against damage during ESD events. Ideally, the breakdown voltage (BV) rating or triggering threshold for a gate protection ESD diode is tailored to the gate voltage rating of the protected source down NMOS device. However, integrating ESD protection diodes using source/drain implants and masks concurrently used to fabricate the protected transistor can lead to difficulty in supporting a wide range of source down power MOSFET gate voltage ratings and sometimes results in wide ESD diode breakdown voltage (BV) distribution, thereby reducing manufacturing yield.

SUMMARY

Disclosed examples provide semiconductor devices and integrated circuits (ICs) with a source down transistor and an ESD protection diode, as well as fabrication techniques. The transistor source/drain implantations and the ESD protection diode junction implants are separated to facilitate tailoring of protection diode breakdown voltage ratings to the gate voltage rating of a particular transistor, as well as to facilitate low protection diode breakdown voltage variation and enhanced production yield. Disclosed examples include a source down transistor with a gate, a body region, an n-type source region, an n-type drain region and a p-type contact region below the n-type source region, along with a protection diode which includes an n-type cathode region, and a p-type anode region below the n-type cathode region implanted at an implant dose and an implant energy to provide a depth and implanted dopant concentration determined by a desired diode breakdown voltage. In certain examples, the dopants for the transistor source region and the diode anode region are separately implanted at different implant energy levels using separate masks, and these regions are implanted at different dopant doses to enhance the ability to control the diode breakdown voltage independent of the protected transistor design.

DETAILED DESCRIPTION

Figure 1:
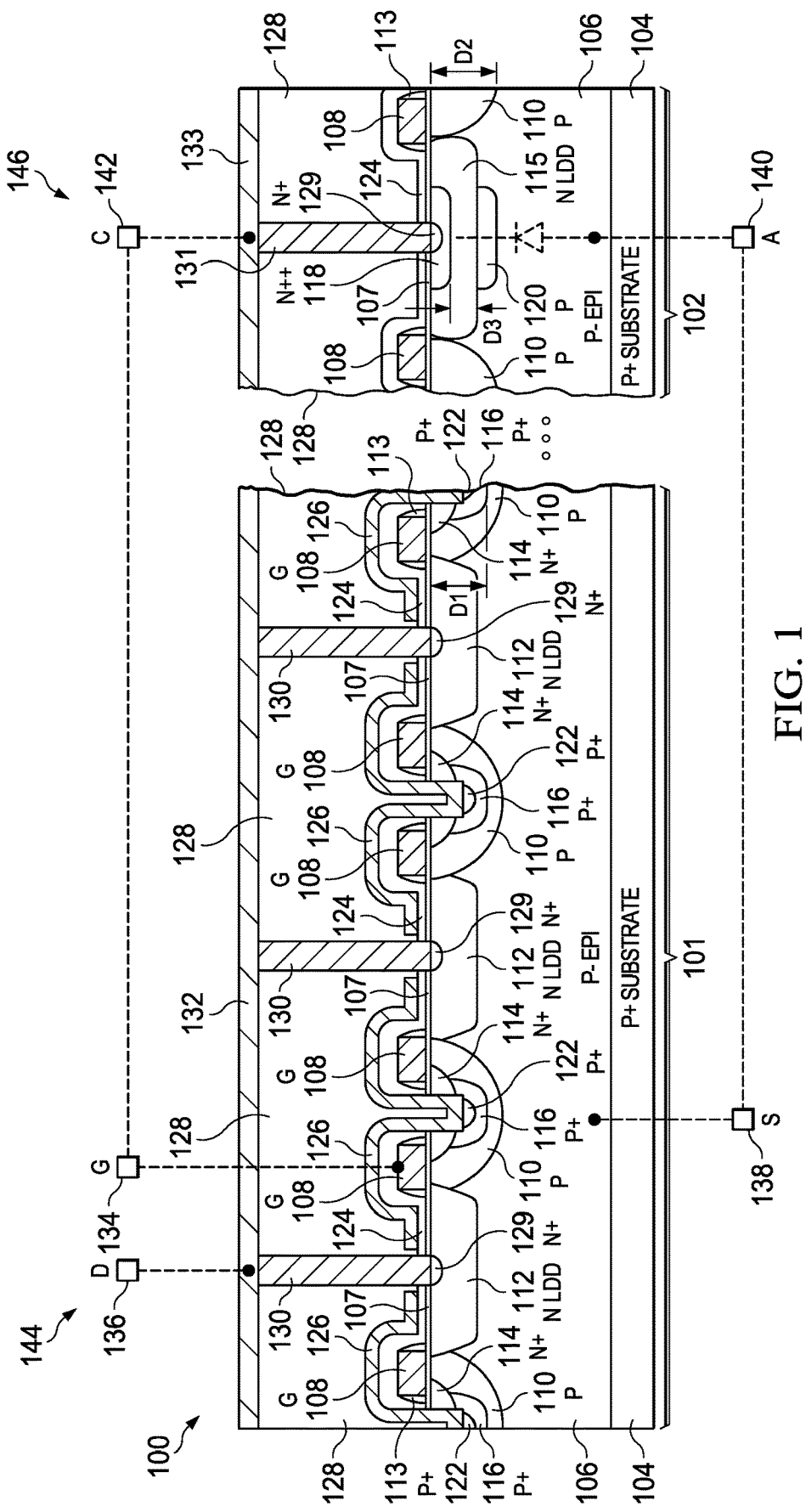
FIG. 1 is a partial sectional side elevation view of an example IC with a source down NMOS transistor formed in a first substrate region and an ESD protection diode with first and second cathode implants in a second substrate region.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to".

Figure 2:
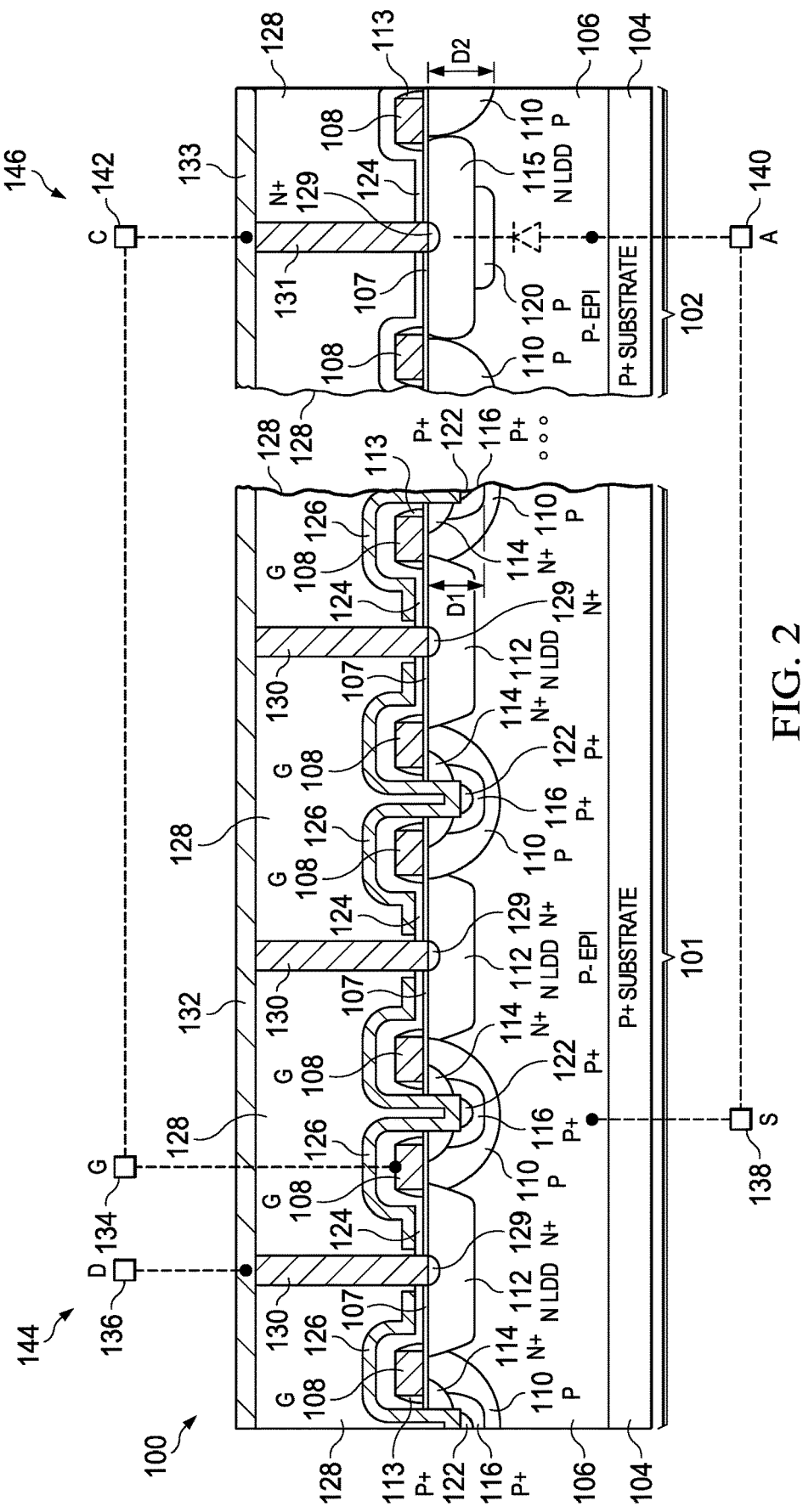
FIG. 2 is a partial sectional side elevation view of another example IC with a source down NMOS transistor and an ESD protection diode with a single cathode implant.
Figure 3:
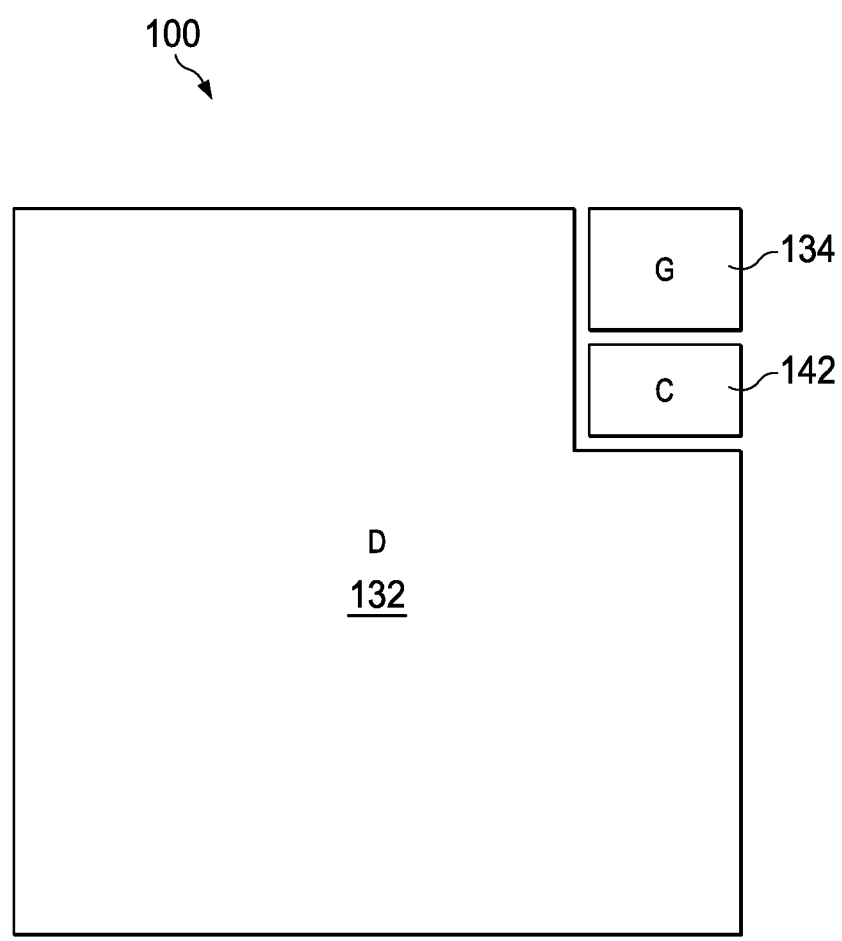
FIG. 3 is a simplified top plan view of the IC examples of FIGS. 1 and 2.

Referring initially to FIGS. 1-3, FIGS. 1 and 2 show partial side views of two example integrated circuits (ICs) 100 that include a source down NMOS transistor 144 formed in a first substrate region 101 and an ESD protection diode 146 formed in a second substrate region 102. FIG. 3 shows a simplified top view of the IC examples of FIGS. 1 and 2. In the example of FIG. 3, separate top view of different device areas provided for the drain area D (132) and the gate pad area G (134) of the source down transistor 144, along with an optional cathode area C for the protection diode (142). The cathode of the protection ESD diode in certain examples is connected to the gate pad of the source down transistor through the metallization layer or layers. In the illustrated example, moreover, the source down transistor construction provides a bottom side connection for both the transistor source and diode anode (not shown in FIG. 3). The protection diode can also be arranged underneath the gate pad to save the silicon area. The concepts of the present disclosure can be implemented in a variety of different product packaging configurations, including integration of more than one transistor and associated protection diodes, for example, to implement a high side driver and a low side driver for a buck converter or other switching power supply IC product, with suitable corresponding external contacts or connections (e.g., pins and/or pads) for a given integrated circuit design.

The example ICs 100 provide a transistor and an integrated ESD protection diode with stable ESD diode breakdown voltage distribution for improved manufacturing yield. The present disclosure also provides flexible semiconductor device fabrication techniques to support a wide range of source down power MOSFET transistor gate voltage ratings along with integrated ESD protection diodes in which one or more implantations are performed separately for the transistor and the diode to facilitate tailoring of protection diode breakdown voltage ratings to the gate voltage rating of a particular transistor.

The IC 100 in FIG. 1 includes a p-type semiconductor substrate having first and second substrate regions 101 and 102 laterally spaced from one another. Any suitable substrate structure can be used, for example, a p-type silicon wafer, or a substrate that includes a different semiconductor material. In the illustrated examples, the substrate is a base 104 which includes p-type silicon, and a p-type epitaxial silicon layer 106 disposed over the p-type base 104. As used herein, the first and second substrate regions 101 and 102 include the laterally spaced portions of the base 104 and the epitaxial layer 106 as well as structures formed therein and above a top surface of the substrate, such as gate or boundary structures, contact structures, dielectric layers, etc. In the illustrated example, one or more transistors 144 are formed in the first substrate region 101, meaning at least partially on, above and/or in the lateral portion 101 of the substrate. Similarly, one or more diodes 146 and associated structures are formed at least partially on, above and/or in the lateral second portion 102 of the substrate, and these structures are referred to herein as being in the second substrate region 102. The transistor 144 in FIG. 1 includes a number of parallel connected segments formed in the first substrate region 101, which collectively constitute a single NMOS source down transistor. For ease of discussion, the components of the transistor 144 are referred to herein in singular form (e.g., a gate, a drain, a source, etc.). In other implementations, no segmentation is used and the transistor 144 is formed by a single gate structure, a single source structure and a single drain structure.

The example transistor 144 includes a gate 108 disposed over a gate dielectric layer 107 over the top surface of the semiconductor substrate 104, 106 (e.g., over the top or upper surface of the epitaxial silicon layer 106) in the first substrate region 101. The individual transistor gate structure segments 108 in FIG. 1 each extend laterally between first and second ends. Any suitable gate structure material or materials can be used in the gate structure 108, for example, doped polycrystalline (POLY) silicon, metals, etc. The gate dielectric layer 107 in one example is an oxide material, such as silicon dioxide ($SiO_2$). Similar structures 107, 108 are formed in the second substrate region 102, and are referred to herein as boundary structures. The gate and boundary structures 107, 108 further include sidewall spacers 113 formed along the lateral sides or ends of the structures 108. The segmented gate structures 107,108 in the first substrate region 101 can be physically connected to one another in one example by laterally extending cross-over structures not shown in the cross-sectional views of FIGS. 1 and 2. In certain examples, the transistor gate structures in the first region 101 are electrically connected to one another using conductive contact structures and overlying metallization layer structures (not shown) to operate as a single electrical gate for the transistor 144.

The example transistor 144 in the first region 101 also includes a p-type body region 110 disposed in the epitaxial layer 106 under a first portion of the gate dielectric layer 107 in each segment in the first substrate region 101. A doped n-type drain (N LDD) region 112 is disposed in the epitaxial layer 106 below the top surface in the first substrate region 101. The drain region 112 includes a lateral first end under a portion of the gate dielectric layer 107 adjacent to the p-type body region 110, and a second end which is laterally spaced from the second lateral end of the gate 108 to form an extended drain drift region. The transistor 144 further includes an n-type source region 114 disposed in a portion of the body region 110 under a second portion of the gate dielectric layer 107 below the first lateral end of the gate 108 in the first substrate region 101. In addition, a p-type implanted body contact region 116 is disposed below the n-type source region 114 in the body region 110. The p-type body contact region 116 is included to lower the body resistance in the local area, and to provide a low resistance connection to the substrate. A p-type contact region 122 is formed in, and is electrically connected to, the p-type body region 110 through the p-type body contact region 116 in the p-type body region 110. In certain examples, the p-type body contact region 116 is omitted.

An oxide spacer layer 124, such as tetraethyl orthosilicate (TEOS or tetraethoxysilane), is disposed over the gate structures 107, 108, 113 in the first substrate region 101, and similar spacer layers 124 are disposed over the boundary structures 107, 108, 113 in the second substrate region 102. The individual transistor segments also include a conductive contact structure 126 which contacts the p-type source contact 122 and the n-type source region 114, thereby electrically connecting the n-type source region 114 to the p-type substrate 104. The conductive contact structure 126 is spaced from the transistor gate structures 107, 108, 113 by the spacer layer 124 and extends at least partially above the gate 108 and the drain region 112 to form a field plate or electrode shield structure. A pre-metal dielectric (PMD) or first inter-layer dielectric (ILD) layer 128 is formed over the field plate structure 126. In one example, the ILD layer 128 comprises TEOS material. An n-type drain contact 129 is disposed in the n-type drain region 112 in the first substrate region 101, and is laterally spaced from the second lateral end of the gate 108. The transistor 144 is a source down structure in which the source current is directed downward into the p-type epitaxial layer 106 and the underlying p-type silicon substrate base 104. A contact (not shown) can be provided for external electrical connection to the transistor source at the bottom of the base 104. The field plate structure 126 provides a charge balanced condition in the extended drain structure drift region for low on-state resistance to reduce transistor power dissipation and supports a higher voltage over a shorter length drift region to save cost and reduce circuit area.

The protection diode 146 in the second substrate region 102 includes an n-type cathode region 115 disposed in the second substrate region 102 below the top surface of the epitaxial layer 106. In one example, the cathode region 115 is formed contemporaneously with the transistor lightly doped N LDD region 112 using a single LDD implant, and both regions 112 and 115 have the same or similar dopant concentrations and depths. In other examples, the regions 112 can be separately formed and may have different depths and/or dopant concentrations. The diode 146 further includes a p-type anode region 120 disposed in the second substrate region 102 below the n-type cathode region 115. The anode region 120 is implanted with p-type dopants at an implant dose and an implant energy to provide a vertical depth and dopant concentration determined by a desired diode breakdown voltage. The breakdown voltage of the protection diode in certain examples will depend on one or both of the vertical location and doping density of the anode region 120. The anode region 120 could cut into and overwrite bottom portion of the N LDD region 112 for a low breakdown voltage protection diode, just bound with the N LDD region 112 for a medium breakdown voltage protection diode, or separate away from the N LDD region 112 for a high breakdown voltage protection diode. Also, the higher the p-type doping density in the anode region 120, the lower the protection diode breakdown voltage. An n-type cathode contact 129 is disposed in the n-type cathode region 115 of the epitaxial layer 106 in the second substrate region 102. In one example, the cathode contact 129 is formed contemporaneously with the n-type drain contact 129 of the first substrate region 101, although not a requirement of all possible implementations.

The spacer layer 124 and the ILD dielectric layer 128 extend over the diode 146 in the second substrate region 102. Conductive structures 130 and 131 extend through the ILD layer 128 in the first and second substrate regions 101 and 102, respectively. In one example, the contact structures 130 and 131 are tungsten (W), although other conductive metal materials can be used. The tungsten contact structures 130 in the first substrate region 101 extend through the ILD layer 128 and to an overlying metallization layer conductive structure 132 that interconnects the drain portions of the individual transistor segments together. The tungsten contact structure 131 extends through the ILD layer 128 between the cathode contact 129 and an overlying metallization layer conductive structure 133. In this example, the conductive structures 131 and 133 extend above the top surface of the epitaxial layer 106 and electrically connect the gate 108 to the n-type cathode region 115 via the cathode contact 129 through interconnections not shown in the sectional view of FIG. 1. In this manner, the protection diode 146 operates to protect the gate 108 of the transistor 144 in the event of an ESD occurrence. In particular, if the gate voltage, and hence the voltage at the conductive structures 131 and 133, exceeds the breakdown voltage level of the protection diode 146, the diode conducts current to safely discharge the protected transistor gate 108.

In the example of FIG. 1, the IC 100 includes conductive pins or pads or other IC terminals 134, 136, 138, 140 and 142 to provide external electrical connectivity to the electrical terminals of the transistor 144 and/or of the protection diode 146. In certain implementations, these are implemented through backend processing and contact formation using one or more metallization layers, in addition to providing one or more bottom contacts or terminals 138 and 140 for electrical connection to the transistor source (S) and the diode anode (A). In another possible implementation, the substrate base 104 is connected to a single external contact (e.g., pin or pad) to provide external connectivity to both the transistor source S and the connected diode anode A. In one possible example, moreover, a separate external pin or pad need not be provided for the protection diode cathode (C) (e.g., the contact 142 can be omitted in FIG. 1), and external pins or pads 134 and 136 are provided for the transistor gate (G) and the drain (D), respectively.

The example IC 100 of FIG. 1 includes a second n-type cathode region 118 disposed in the n-type cathode region 115 above the p-type anode region 120. In one example, the second cathode region 118 is more heavily doped (e.g., higher dopant concentration) than the N LDD region 115. In certain examples, the second n-type cathode region 118 is vertically spaced from the p-type anode region 120 by a non-zero distance D3 as shown in FIG. 1. In other possible implementations, the n-type second cathode region 118 extends downward to the top of the p-type anode region 120. In one example, the first cathode region 115 is implanted with Phosphorus impurities, the second cathode region 118 is implanted with Arsenic impurities, and the p-type anode region 120 is implanted with Boron impurities. In certain examples, the n-type second cathode region 118 is omitted.

FIG. 2 illustrates another example implementation of the IC 100, including a source down NMOS transistor 144 in a first substrate region 101 and a protection diode 146 in the second substrate region 102. The IC 100 in FIG. 2 is the same in most respects as the IC of FIG. 1 as described above, with the exception that the n-type region 118 of FIG. 1 is omitted in the example of FIG. 2. In the examples of FIGS. 1 and 2, the separate fabrication of the p-type regions 116 and 120 allows separate engineering of the protection diode breakdown voltage rating, independent of the transistor source fabrication processing. In certain implementations, for example, the Boron doping parameters (e.g., implant energy, implant dose) can be adjusted for the anode region 120 in order to tailor the resulting protection diode breakdown voltage rating for a given application (e.g., to protect a transistor gate of a particular voltage rating). In certain examples, the p-type body contact region 116 and the p-type anode region 120 have different dopant concentrations.

The independent creation and construction of the p-type body contact region 116 and the p-type anode region 120 facilitates the ability to tailor the diode breakdown voltage to a specific value, for example, to provide a desired protection level for protecting the transistor gate 108 during an ESD event. In addition, the separate construction of the regions 116 and 120 advantageously allows formation of a deeper anode region 120 (e.g., depth D2>D1), and moves the p-n junction of the protection diode from the bottom of region 118 to the bottom of the region 115. The relocation of the p-n junction enhances breakdown voltage stability across process variations, leading to improved production yield as illustrated below in connection with FIGS. 16 and 17. Moreover, the use of separately formed transistor body contact and diode anode regions 116 and 120 allows a variety of independent adjustments of the diode and transistor operating parameters for a given application. This is advantageous compared with concurrently implanting the transistor source and the anode region of the diode. In that alternative, the implant energy (e.g., Boron implant) tailored for forming the transistor source results in a shallow ESD diode p-n junction, which is subject to large variation due to implant and thermal variation. This variability in the diode p-n junction can adversely cause large variation in ESD BV. As a result, the increased diode breakdown voltage variation leads to increased yield loss and/or increase cost for tighter fabrication process controls in order to provide an acceptable manufacturing yield. In certain design circumstances, moreover, the p-type implant energy used in creating the transistor source can be limited to a point where the ESD protection diode breakdown voltage cannot be increased to a desired level, for example, to support transistor designs having a 20 V gate rating, etc. In contrast, the depth of the implanted anode region 120 can be controlled independently of any transistor source design constraints in order to provide any desired level of ESD diode breakdown voltage protection. Thus, the disclosed example ICs 100 provide a flexible solution allowing separate tailoring of the design and performance characteristics of the source down NMOS transistor 144 and the associated ESD protection diode 146. In the illustrated examples, the p-n junction that defines the ESD diode 146 is formed deeper (e.g., D2) in the structure compared with the depth D1 of the body contact region 116.

Referring now to FIGS. 4-15, FIG. 4 illustrates an example method 400 for making an IC with a transistor and a protection diode, and FIGS. 5-15 show the IC 100 of FIG. 1 at different stages of fabrication according to the method 400 to provide a source down NMOS transistor 144 and an associated ESD protection diode 146 to provide protection for the transistor gate. The example ICs 100 advantageously provide separate processing for the transistor source and the protection diode anode. In the method 400, the lightly doped drain (LDD) source/drain implant is shared between the fabrication processing of the transistor 144 and the diode 146, although not a requirement of all possible implementations. However, sharing this processing step advantageously reduces cost and the number of masks needed to produce the IC 100. One advantage of the method 400 is that the p-type anode implant (e.g., to form region 120 in FIGS. 1 and 2) is independent of the MOSFET and the NSD mask is independent of the ESD diode 146. This advantageously provides flexibility to adjust the Boron implant dose and energy for the anode region 120 of the protection diode 146 to provide a stable BV region of the diode p-n junction. This approach also facilitates adjustment (e.g., of the implant used to form the anode region 120) to support a wide variety of gate ratings to be accommodated by the constructed ESD protection diode 146. Moreover, the method 400 facilitates creation of a protection diode 146 with very stable breakdown voltage ratings compared with other solutions in which the diode p-n junction between the N+(source/drain doping) and Boron compensated N-LDD region suffers from large diode BV variation and is generally not suitable for ESD diode protection of 20 V or higher gate rated devices.

Figure 4:
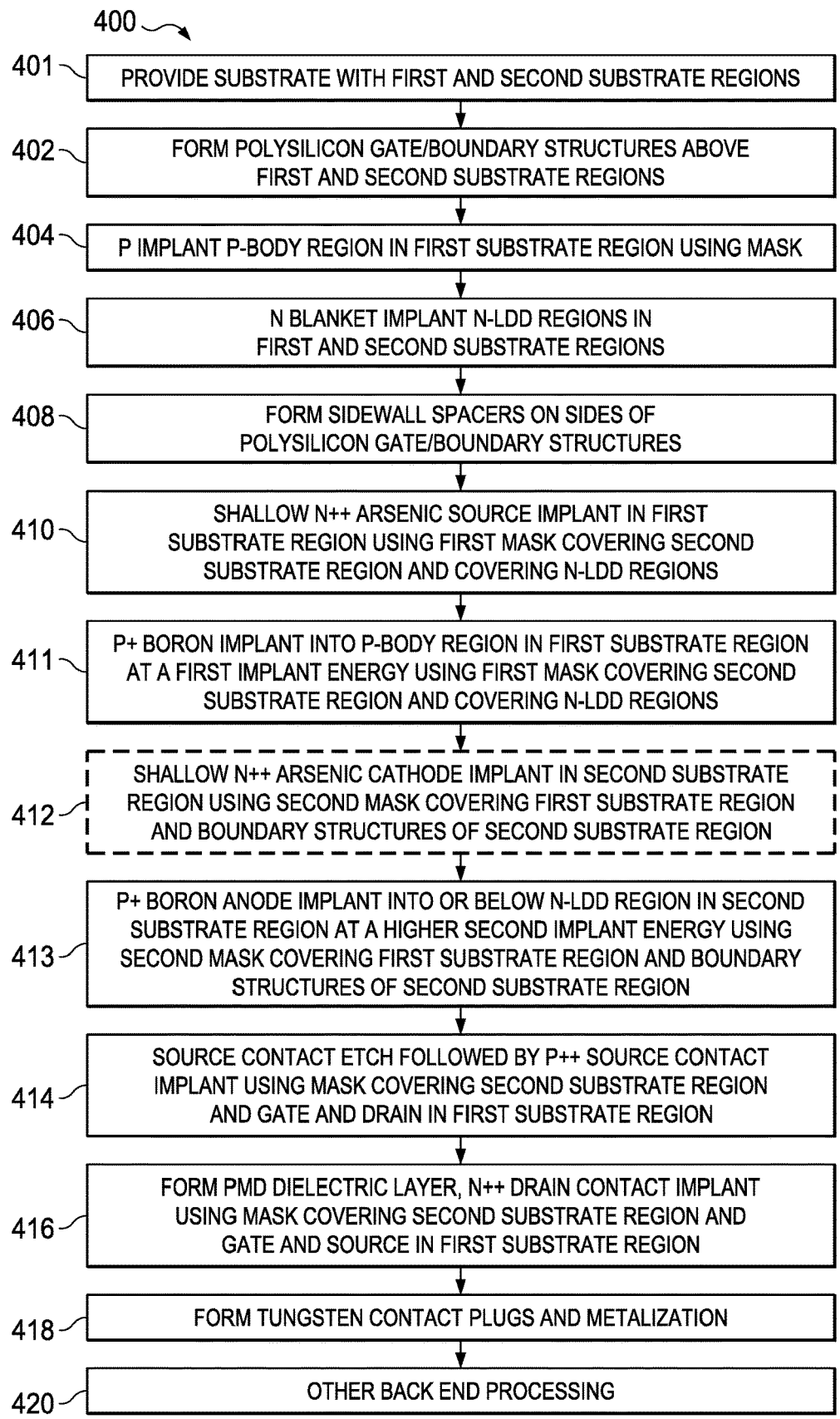
FIG. 4 is a flow diagram that shows a method for making an IC with a transistor and a protection diode.
Figure 5:
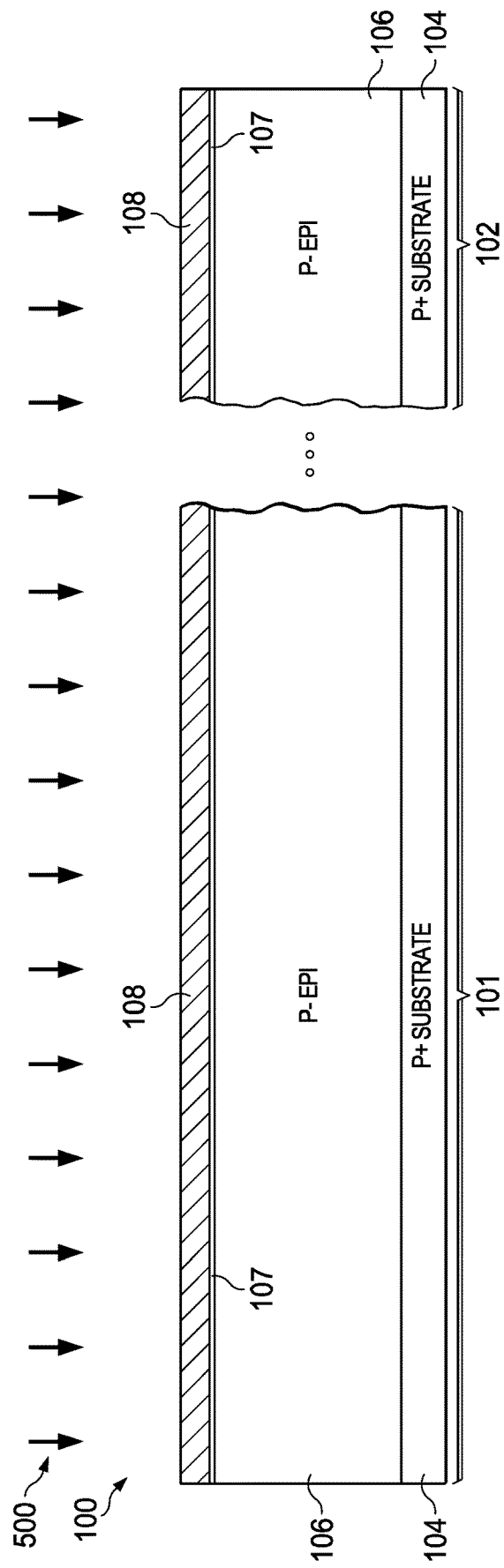
FIGS. 5-15 are partial sectional side elevation views of the IC of FIG. 1 at different stages of fabrication to provide a transistor and a protection diode.

The method 400 in FIG. 4 begins at 401, including providing a p-type semiconductor substrate, for example, the p-type silicon base 104 and the overlying p-type epitaxial silicon layer 106 with a top surface and laterally spaced first and second substrate regions 101 and 102 in the example of FIG. 5. In one example, a p-doped silicon wafer base 104 is provided at 401. A substrate of a different semiconductor material can be provided at 401 in other implementations. In the illustrated example, an epitaxial layer 106 is formed on the silicon substrate base 104 using an epitaxial growth deposition process, and the transistor 144 and diode 146 are formed on/in the epitaxial layer 106 as described hereinafter. In other implementations, the epitaxial layer 106 is omitted.

Figure 6:
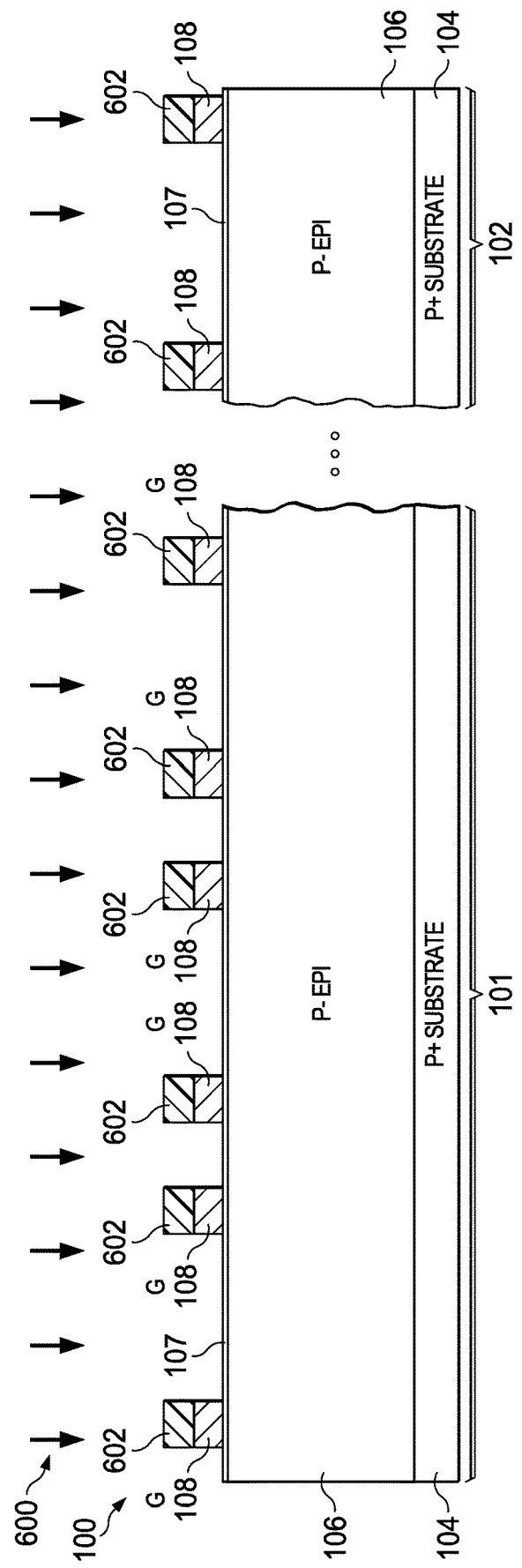
Figure 7:
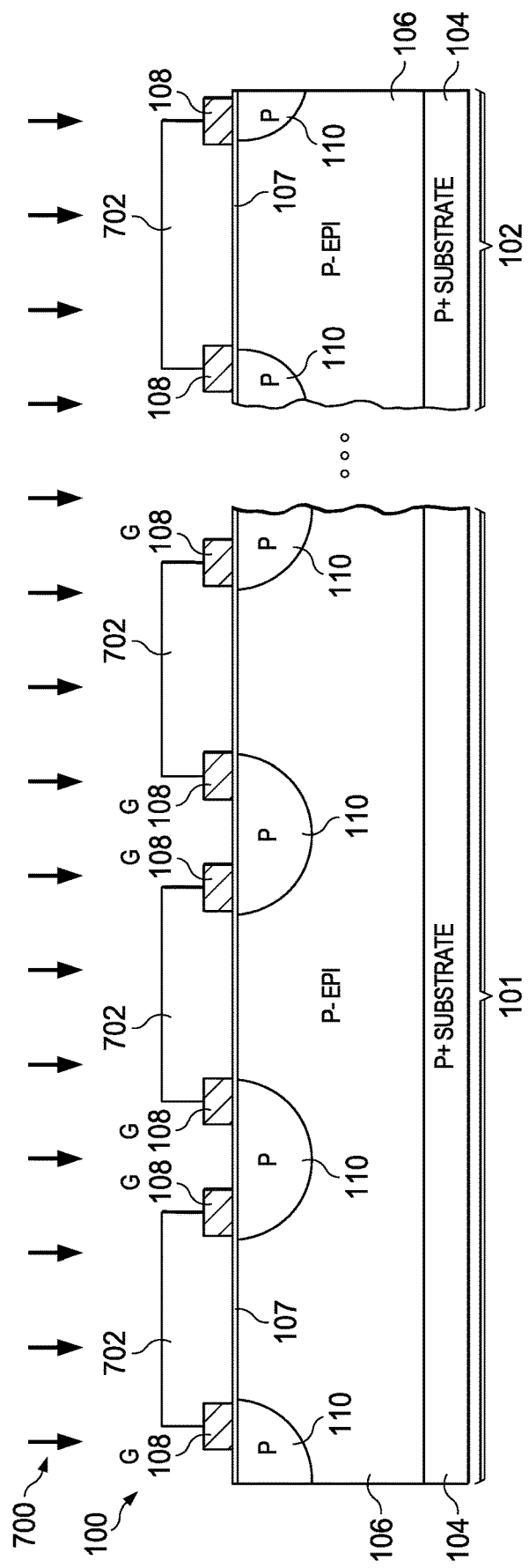
Figure 8:
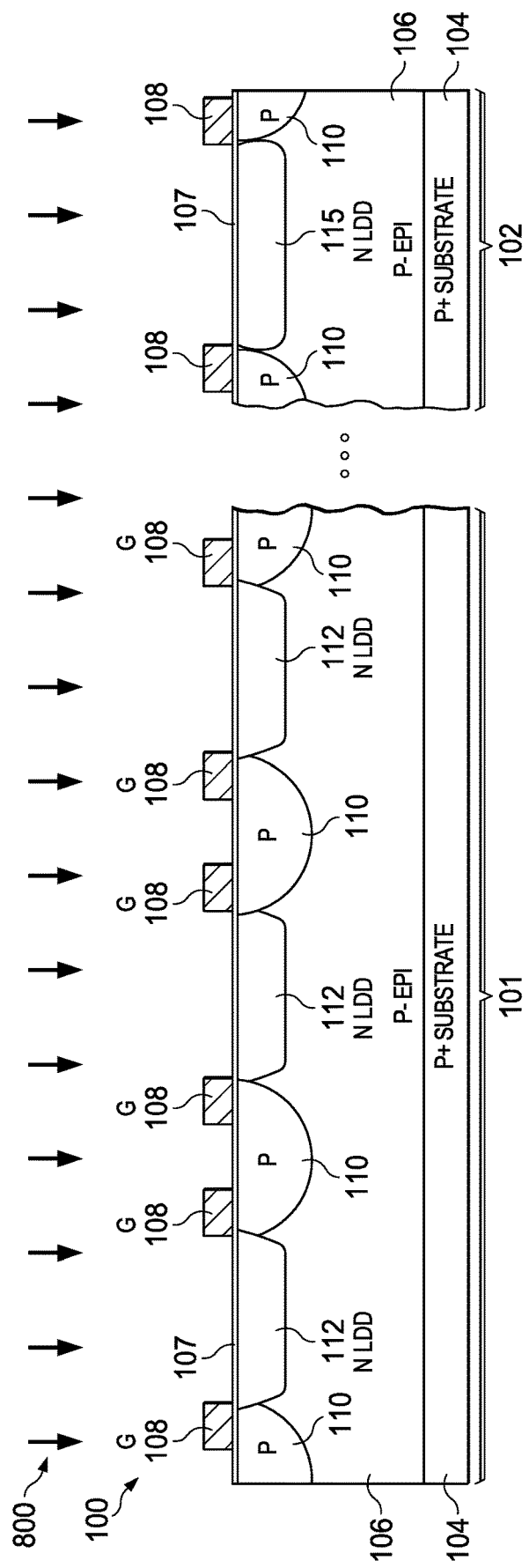

As seen in FIGS. 5 and 6, the method 400 further includes forming a patterned gate structure at 402 in FIG. 4. In one example, the processing at 402 provides the first region transistor gates and the diode region boundary structures including the gate dielectric layer 107 and patterned polysilicon gate structures 108. A gate dielectric layer 107 is formed over the top surface of the epitaxial silicon layer 106, and a deposition process 500 is performed in FIG. 5 to form a polysilicon layer 108 in the first and second substrate regions 101 and 102. As shown in FIG. 6, an etch process 600 is performed using a photo mask 602 to form the patterned gates 108 disposed over the gate dielectric layer 107.

At 404 in FIG. 4, p-type dopants are implanted into the substrate to form the p-type body region 110 in the first substrate region 101, and outside of the boundary region in the second substrate region 102. The example of FIG. 7 includes performing an implantation process 700 using a mask 702 to implant p-type dopants into the epitaxial layer 106 to form the body regions 110. In one example, the process 700 implants Boron dopants to form the body regions 110, followed by a thermal anneal process (not shown) to diffuse or drive the dopants to a desired vertical depth and lateral extent in the epitaxial layer 106.

The method 400 in FIG. 4 further includes implanting n-type dopants at 406 into the substrate to form an n-type drain region in the first substrate region, and to contemporaneously form an n-type cathode region in the second substrate region. In other implementations, the n-type drain region and the n-type cathode region can be separately formed using separate masks and implantation processes (not shown). The example of FIG. 8 includes performing a blanket implantation process 800 to implant n-type dopants at a relatively low dose to form lightly doped transistor drain regions 112 in the first substrate region 101 (labeled N LDD in the drawings).

Figure 9:
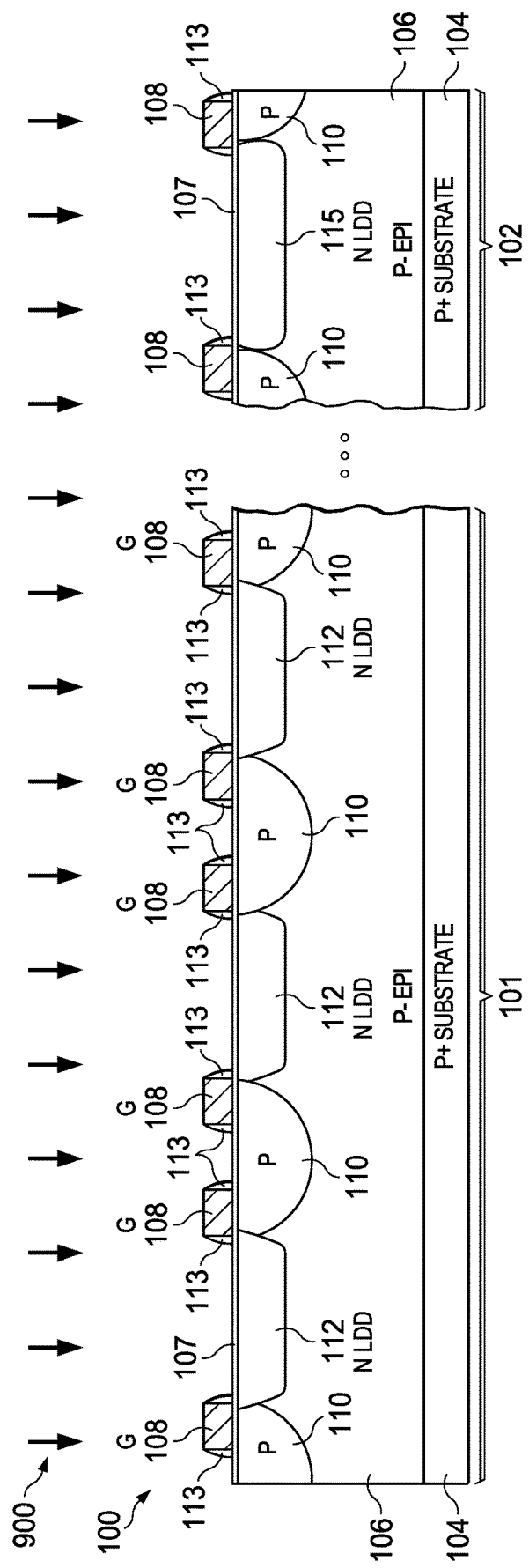
Figure 10:
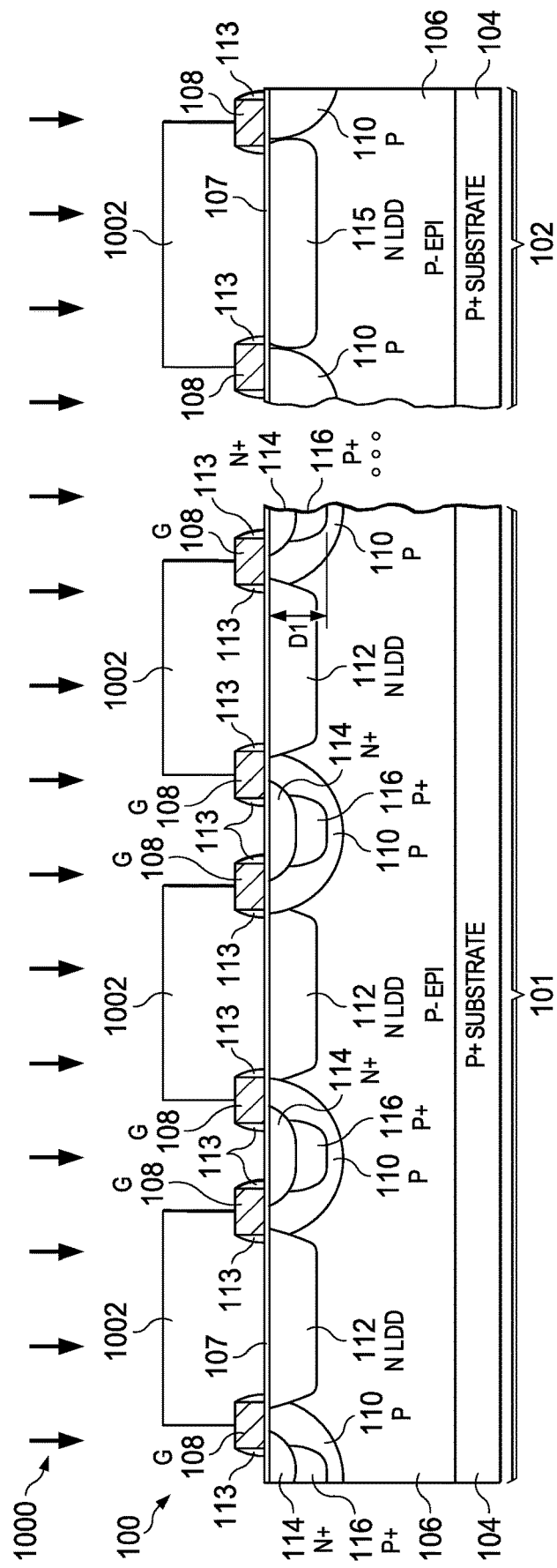

Referring also to FIGS. 9 and 10, sidewall spacers 113 are formed on the lateral sides of the patterned gate structures at 408 in FIG. 4. In FIG. 9, a sidewall spacer formation process 900 is performed to form the sidewall spacers 113 on the lateral sides of the patterned polysilicon gate and boundary structures 108. This can include depositing a generally conformal dielectric material layer (e.g., TEOS material), and etching the deposited material to stop on the top surface of the epitaxial silicon 106 or to stop on the gate dielectric layer 107, leaving the remaining TEOS material to form the sidewall spacers 113 along the sides of the gate and boundary structures 108 as shown in FIG. 9.

The method 400 of FIG. 4 continues at 410 with implanting n-type dopants into the substrate to form an n-type source region in the body region of the first substrate region 101. The example of FIG. 10 includes performing an implantation process 1000 to implant n-type dopants (e.g., Arsenic) into the substrate which forms the n-type source regions 114 in the body region 110 using a first mask 1002 that covers the second substrate region 102 and the N LDD transistor drain regions 112. At 411 in FIG. 4, the method 400 further includes implanting p-type dopants to form a p-type body contact region 116 below the n-type source region 114 in the body regions 110. In the example of FIG. 10, the same first mask 1002 is used to implant p-type dopants (e.g., Boron) into the body regions 110 to form the p-type body contact regions 116 (411 in FIG. 4), and the first mask 1002 is then stripped. In other implementations, the p-type body contact regions 116 are implanted at 411 before the n-type source regions 114 are implanted at 410. In other examples, different masks can be used to implant the n-type regions 114 and the p-type body contact regions 116 in any desired order. The p-type transistor body contact regions 116, moreover, are implanted at 411 using a first implant energy to form the p-type body contact region 116 to a first depth or distance D1 below the top surface of the epitaxial layer 106 as shown in FIG. 10. The depth D1 and the corresponding implant energy of the implantation at 411 are selected according to a given operational design for the prospective source down NMOS transistor 144 (e.g., FIGS. 1 and 2 above).

Figure 11:
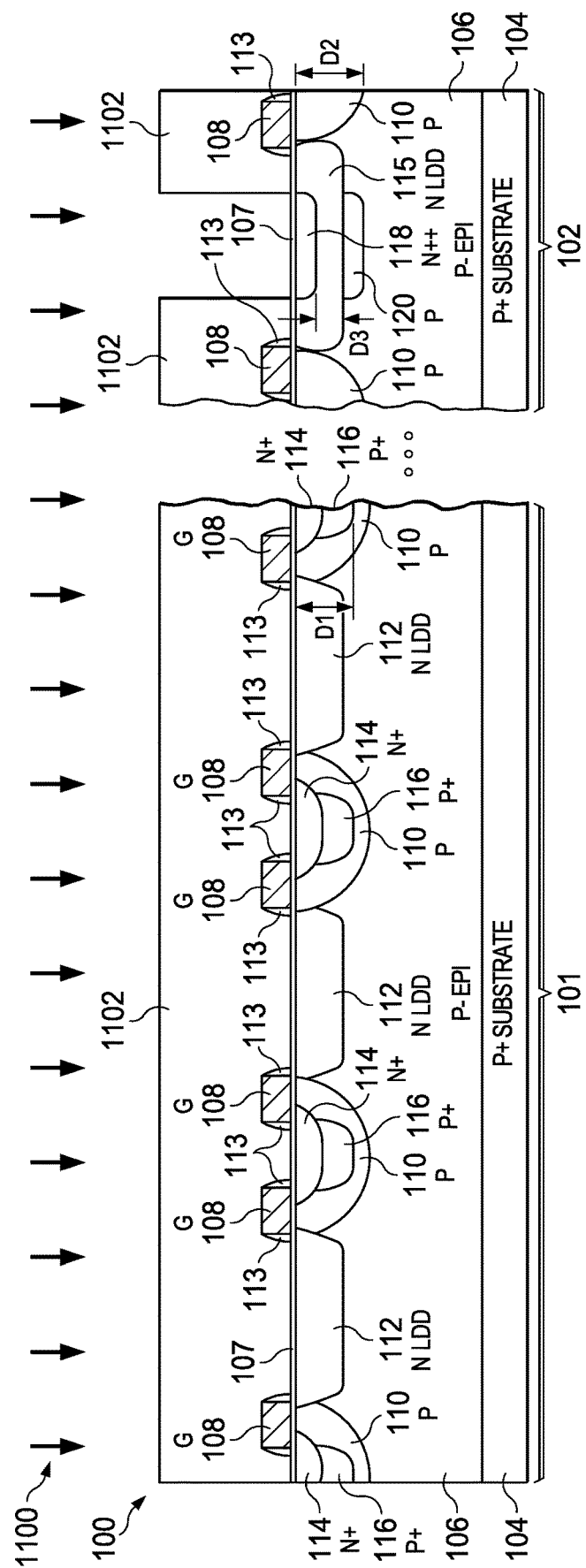
Figure 12:
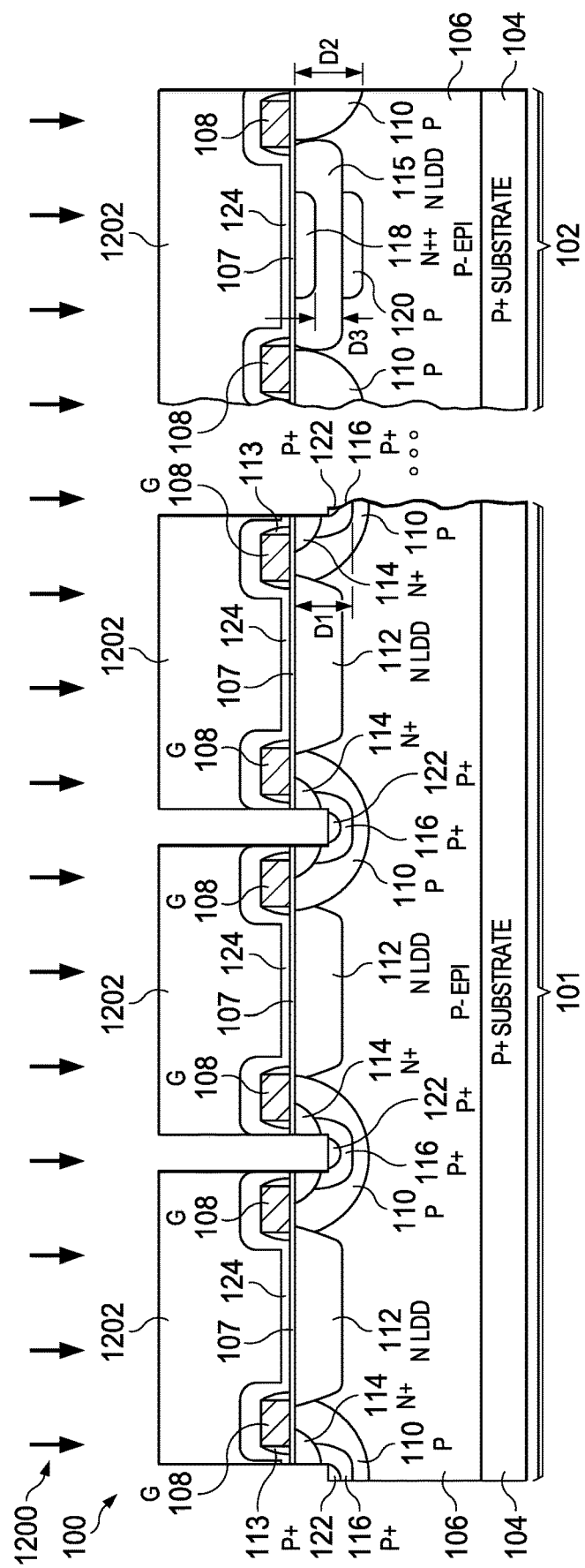

In certain examples, the method 400 in FIG. 4 further includes implanting n-type dopants into the second substrate region at 412 to form the second n-type cathode region 118 in the n-type cathode region 115 above the p-type anode region 120. As previously mentioned, this implantation at 412 can be omitted in other certain examples, as shown in the IC 100 of FIG. 2 above. FIG. 11 shows one example in which a second mask 1102 is used for an implantation process 1100 to form second n-type cathode regions 118. The example second mask 1102 in FIG. 11 covers the first substrate region 101 and portions of the polysilicon boundary structures 107, 108, 113 and parts of the lightly doped n-type cathode region 115 in the second substrate region 102, and exposes an interior portion of the cathode region 115. In one example, Arsenic dopants are implanted at 412 at an implant energy of 20-50 KeV and a dose of 1E14-5E15 cm$^{-2}$ into the uncovered portion of the cathode region 115 in FIG. 11 to form the second n-type cathode region 118 (labeled N++ in the drawings).

At 413 in FIG. 4, the method further includes implanting p-type dopants into the substrate to form the p-type anode region 120 in the second substrate region 102 below the n-type cathode region 115. In the example of FIG. 11, the second mask 1102 is again used with an implantation process to implant Boron into the epitaxial layer 106 at a higher second implant energy of 100-200 KeV and a dose of 1-10E13 to form a p-type anode region 120 below the N LDD region 115 to a second depth D2 in the second substrate region 102, where D2 is greater than D1. The second cathode region 118 is vertically spaced from the p-type anode region 120 by the distance D3 as shown in FIG. 11. Where an n-type cathode region 118 is implanted at 412, the implantations at 412 and 413 can be done in any desired order (e.g., n-type Arsenic implant followed by p-type Boron implant or vice versa). Following the implant or implants, the second mask 1102 is stripped, for example, by an $O_2$ plasma and cleaning process (not shown).

The independent processing of the transistor body contact region 116 and the ESD diode anode region 120 facilitates engineering of the protection diode breakdown voltage rating for a given transistor gate voltage rating. In one example, where the n-type cathode region 118 is included, the cathode region implantation processing at 412 includes implanting Arsenic at an energy of 25 Key and a dose of 5E15, and the Boron implantation at 413 to form the anode region 120 is adjusted in terms of energy and/or dose to achieve a given breakdown voltage for the protection diode 146. In this example, a transistor 144 with a gate voltage rating of 8 V is protected by a diode 146 with a target breakdown voltage rating of 10-11 V by implanting Boron dopants at 413 using an energy of 190 KeV and a dose of 2E13. For a transistor gate voltage rating of 10 V, Boron is implanted at 413 using an energy of 230 KeV and a dose of 2E13. For a transistor gate voltage rating of 20 V, Boron is implanted at 413 using an energy of 550 KeV and a dose of 1E13. These examples are illustrative only and other implant energies and/or doses can be used. Importantly, the dose and/or energy of the p-type implantation processes used to form the p-type body contact region 116 and the p-type anode region 120 are independently adjustable. Moreover, as previously discussed, the use of a second higher implantation energy to form the anode region 120 facilitates forming the anode region 120 to a larger second depth D2 compared to the depth D1 of the p-type body contact region 116. This, in turn, mitigates or avoids the variability in the p-n junction of the protection diode 146, and accordingly improves the stability of the resulting protection diode breakdown voltage across process variations and enhances production yield in manufacturing. At the end of 413 in FIG. 4, in certain examples, a thermal anneal process (not shown) is added to diffuse or drive the dopants to a desired vertical depth and lateral extent in the epitaxial layer 106.

Figure 13:
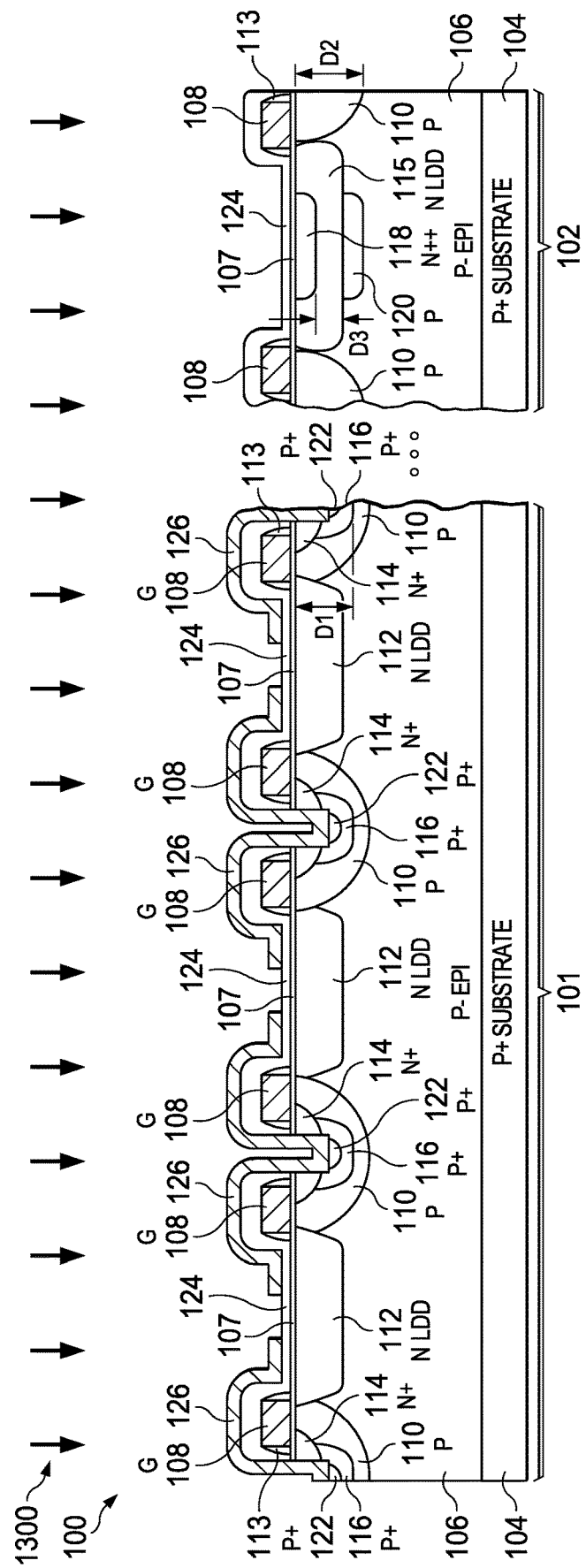

Continuing in FIG. 4, the example method further includes forming the TEOS oxide spacer layer 124 by low-pressure chemical vapor deposition (LPCVD) or other suitable processing. At 414, the method 400 includes implanting (e.g., Boron) into the epitaxial layer 106 using a process 1200 and the same mask 1202 in FIG. 12 to form a p-type contact region 122 which is electrically connected to the p-type body contact region 116 in the p-type body region 110. In one example, the processing 1200 includes etching through the deposited spacer layer material 124 and through a portion of the exposed epitaxial silicon to form a source contact trench that extends through a portion of the n-type source region 114 to expose a portion of the p-type body region 110, followed by implanting the p-type dopants into the source contact region 122 through the openings in the mask 1202. As further shown in FIG. 13, the conductive field plate structure 126 is formed and patterned above the spacer layer 124 using a process 1300. In one example, the field plate structure 126 is formed by depositing conductive material over the spacer layer 124, depositing and patterning a photomask, and performing a field plate etch to remove uncovered portions of the deposited field plate structure material 126. This creates conductive structure that electrically connects the n-type source region 114 and the exposed p-type body region 110. The resulting conductive structure 126 contacts both the side wall of n-type source regions 114 and the p-type contact region 122, and is spaced from and extends at least partially above the gate 108 and the n-type drain region 112 to form a field plate 126 as shown in FIG. 13.

Figure 14:
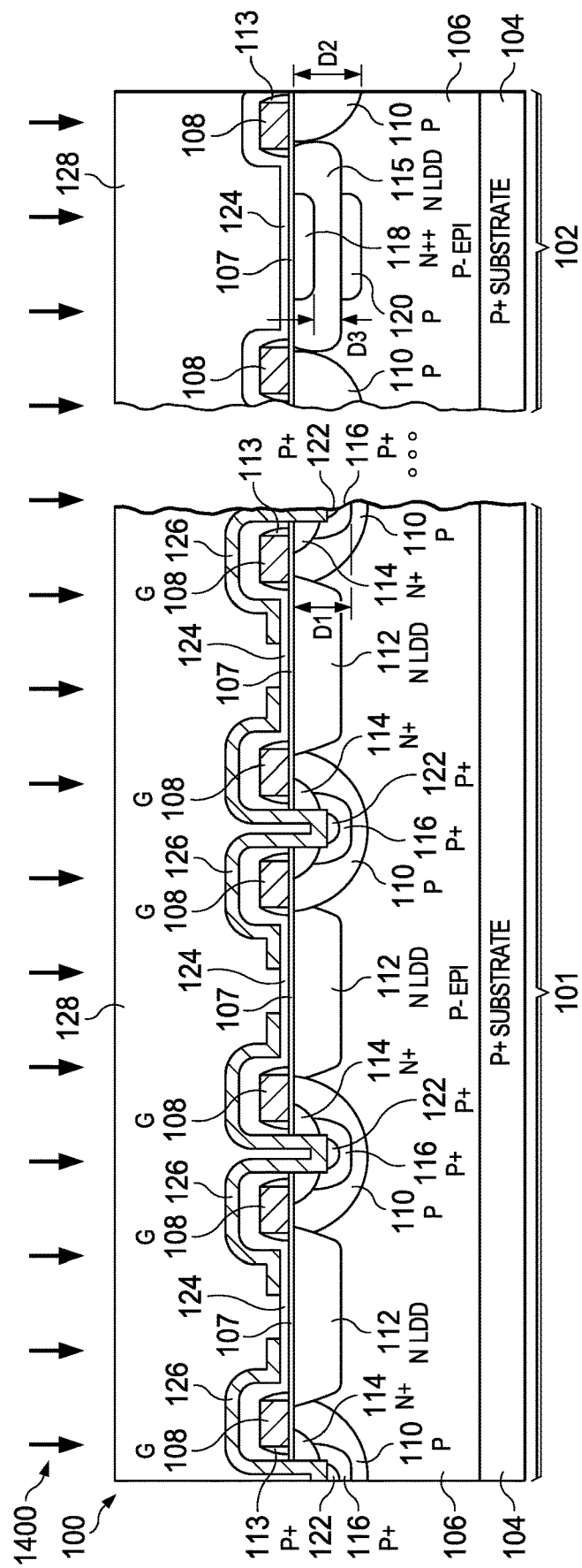
Figure 15:
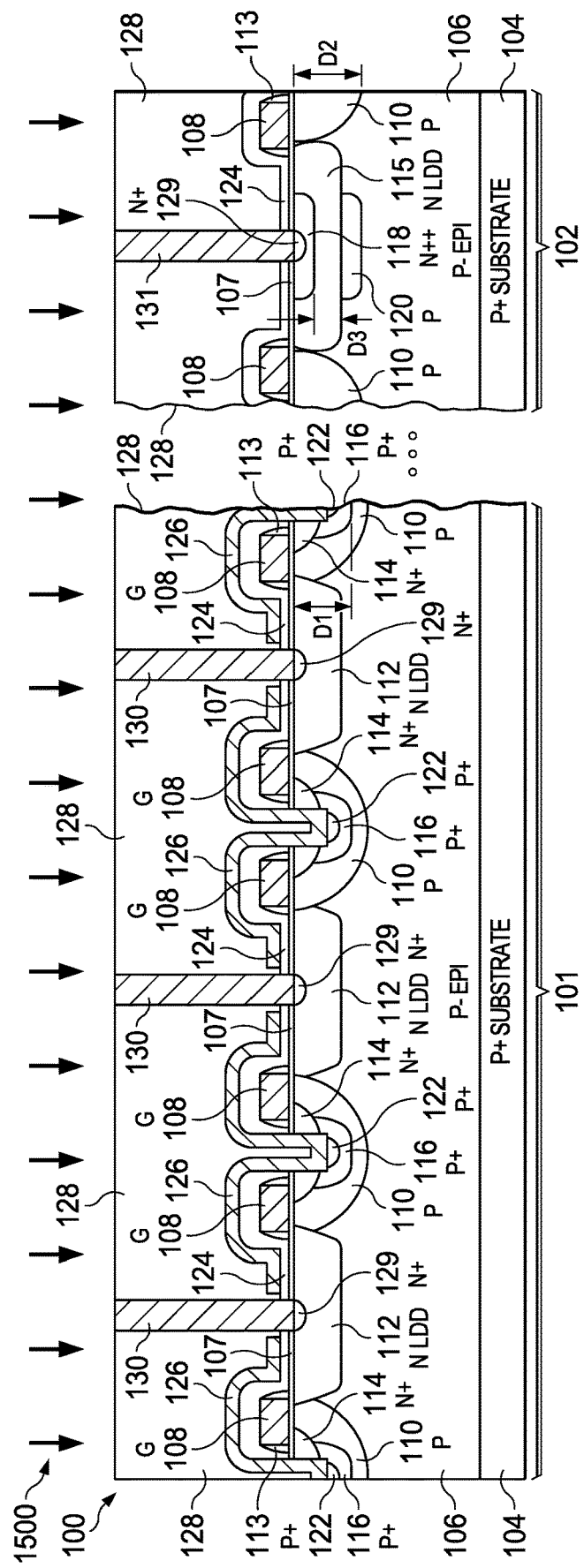

As shown in FIG. 14, the ILD layer 128 is formed over the field plate structure 126, for example, by depositing TEOS material using a deposition process 1400, followed by chemical mechanical polishing (CMP) processing. At 416 in FIG. 4, the process 400 further includes implanting n-type dopants (e.g., Arsenic) into the epitaxial layer 106 to form the n-type drain contacts 129 in the n-type drain regions 112. FIG. 15 shows one example in which the desired contact regions in the transistor drain regions 112, and optionally the n-type cathode region 115, are implanted with Arsenic to form contacts 129. In one example, a contact photomask is deposited and patterned to expose the respective contact regions, and contact openings are etched through the ILD layer 128. Arsenic is implanted through the openings to form the contact 129 in the epitaxial layer 106, and the photoresist mask is stripped. At 418 in FIG. 4, Tungsten or other conductive plug structures 130 and 131 are formed in the contact openings using processing 1500 in FIG. 15, for example, by depositing tungsten over any diffusion barrier layer (e.g., Ti/TiN) to fill the contact openings and provide electrical contact to the contact structures 129, followed by planarizing to provide the structure shown in FIG. 15. The contact structure formation in 418 further includes forming tungsten or other conductive contact structures to electrically connect with the patterned gate structures 108, not shown in the sectional view of FIG. 15. The process 400 includes further back end processing at 420 in order to provide a finished integrated circuit device 100 as shown in FIG. 1. The process 400 can also be used to fabricate the IC example 100 of FIG. 2, for example, by omitting the shallow Arsenic cathode implant step at 412 in FIG. 4.

The process 400 is compatible with existing source down MOSFET processing techniques and equipment, and provides tight ESD protection diode breakdown voltage distribution across a multi-wafer fabrication process. In addition, the method 400 advantageously provides separate processing and engineering of the protection diode breakdown voltage to allow tailoring for a given protection level (e.g., for different protected transistor gate voltage ratings). In addition, the method 400 provide separate processing for the anode and cathode formations of the ESD protection diode to facilitate the ability to provide high breakdown voltage protection diodes 146 independent of the processing and design parameters of the transistor 144.

Figure 16:
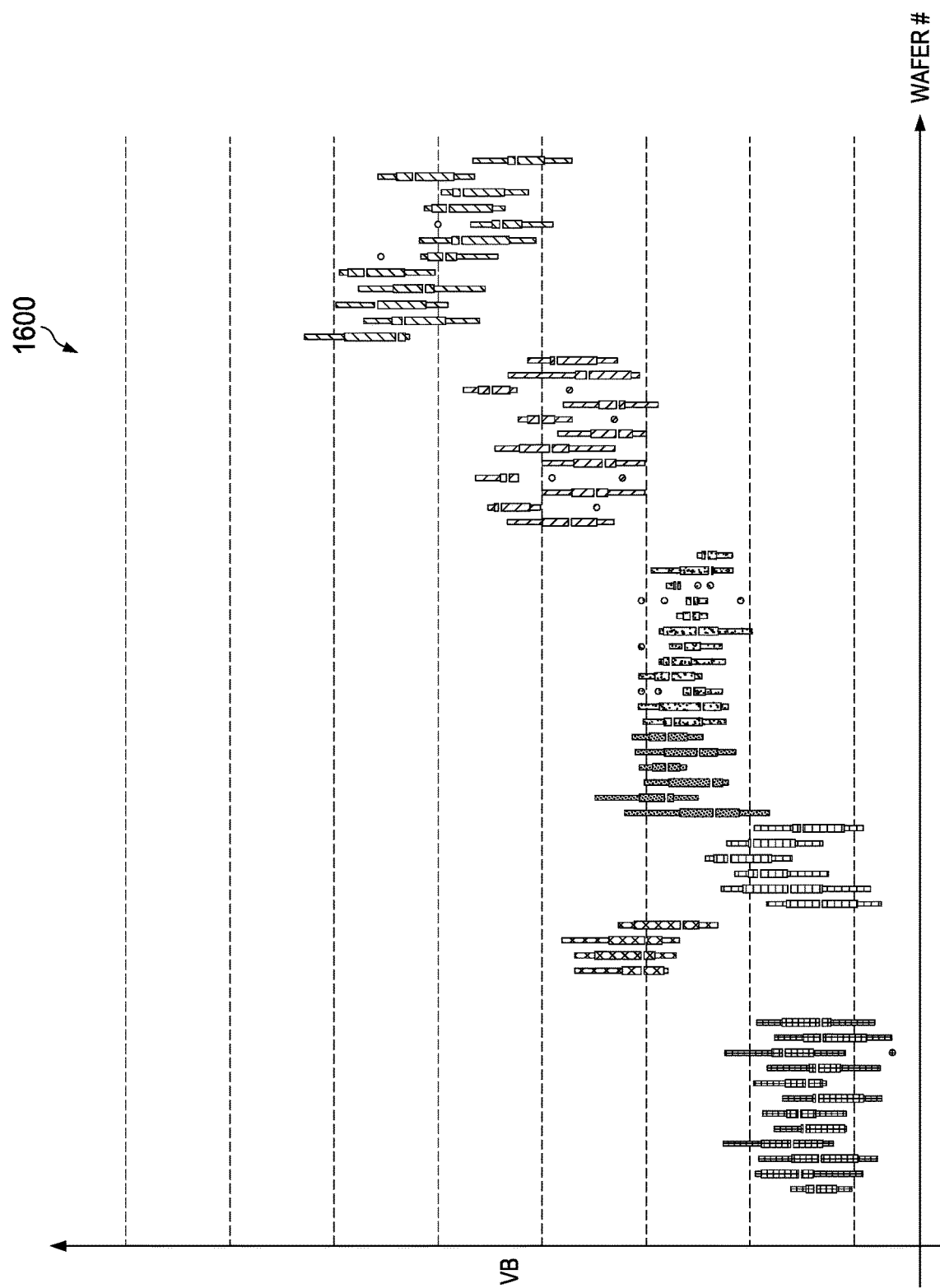
FIG. 16 is a graph that shows protection diode breakdown voltage variation for different wafers fabricated using shared source and cathode implantations.
Figure 17:
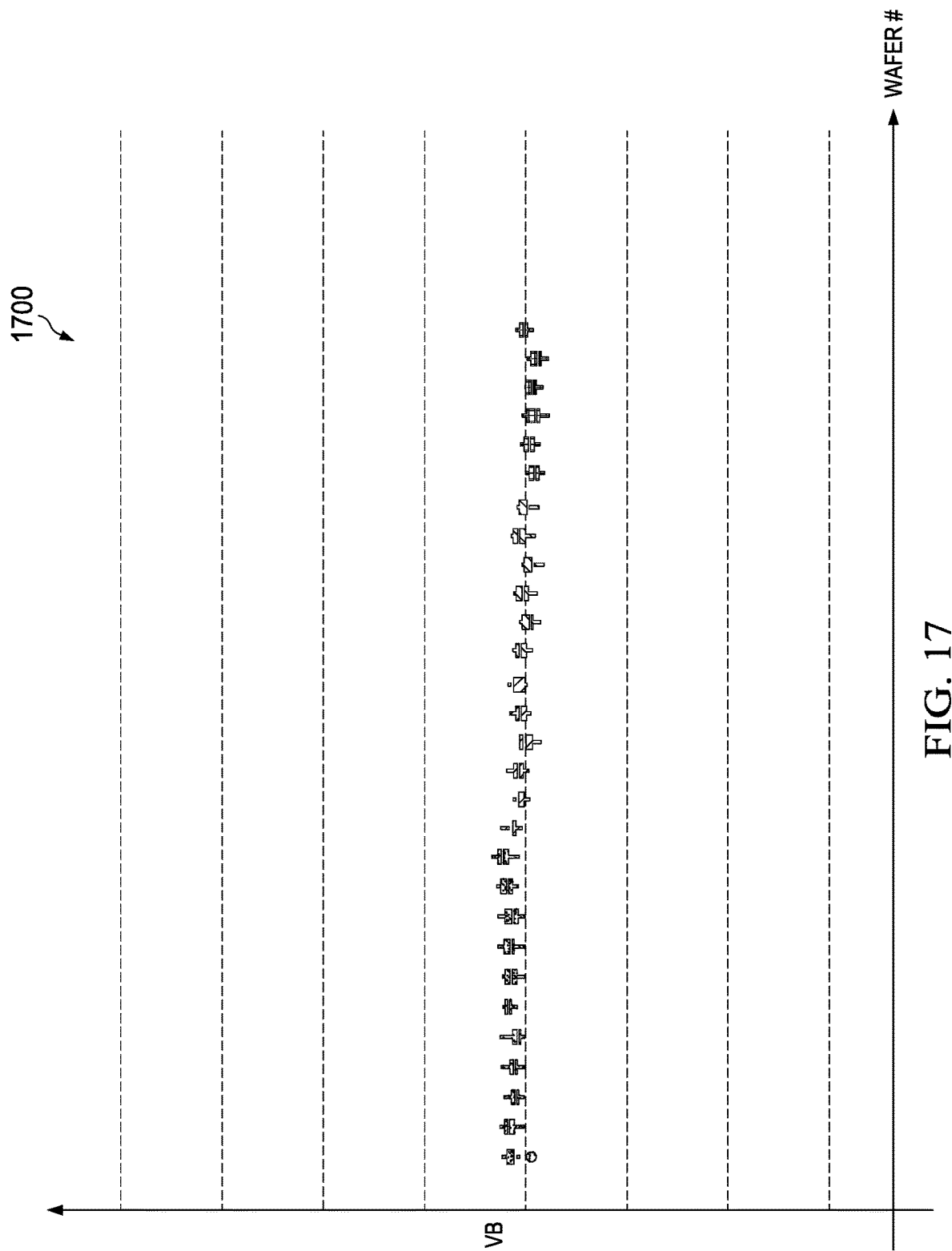
FIG. 17 is a graph that shows protection diode breakdown voltage for different wafers fabricated according to the method of FIG. 4.

Referring also to FIGS. 16 and 17, FIG. 16 shows a graph 1600 that illustrates protection diode breakdown voltages for different wafers fabricated using shared source and cathode implantations. As seen in the graph 1600, use of common processing steps, in particular shared transistor source and protection diode anode p-type implantation steps leads to significant variation in the protection diode breakdown voltage. FIG. 17 provides a graph 1700 that shows protection diode breakdown voltage for different wafers fabricated according to the method 400 of FIG. 4. The disclosed example integrated circuits 100 and the example fabrication method 400 provide significantly better control of the protection diode breakdown voltage compared with the results of FIG. 16.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. A method to fabricate an integrated circuit, comprising:
   providing a p-type semiconductor substrate, including a top surface and laterally spaced first and second substrate regions;
   forming a patterned gate structure in the first substrate region, including a gate disposed over a gate dielectric layer over the top surface of the semiconductor substrate;
   implanting p-type dopants into the substrate to form a p-type body region in the first substrate region;
   implanting n-type dopants into the substrate to form an n-type drain region in the first substrate region, and to form an n-type cathode region in the second substrate region;
   implanting n-type dopants into the substrate using a first mask to form an n-type source region in the p-type body region of the first substrate region; and
   implanting p-type dopants into the substrate at an implant dose and an implant energy determined by a desired diode breakdown voltage using a second mask which covers the first substrate region to form a p-type anode region in the second substrate region below the n-type cathode region.

2. The method of claim 1, further comprising:
   implanting n-type dopants into the substrate using the second mask to form a second n-type cathode region disposed in the n-type cathode region above the p-type anode region.

3. The method of claim 2, further comprising:
   implanting p-type dopants into the substrate using the first mask to form a p-type body contact region below the n-type source region in the first substrate region.

4. The method of claim 3, including implanting the p-type body contact region and the p-type anode region at different dopant doses.

5. The method of claim 3, including implanting the p-type body contact region and the p-type anode region at different implantation energies.

6. The method of claim 1, further comprising:
   opening a source contact hole by etching through a portion of n-type source region to expose the p-type body region;
   implanting p-type dopants into the exposed p-type body region to form a p-type contact region electrically connected to the p-type body region; and
   implanting n-type dopants into the substrate to form an n-type drain contact in the n-type drain region in the first substrate region.

7. The method of claim 1, further comprising:
   forming a first conductive contact structure above the top surface of the semiconductor substrate which electrically connects the gate to the n-type cathode region.

8. The method of claim 1, further comprising:
   forming a conductive contact structure which contacts the n-type source region, the conductive contact structure spaced from and extending at least partially above the gate and the n-type drain region to form a field plate.

9. The method of claim 1, further comprising:
   implanting p-type dopants into the substrate using the first mask to form a p-type body contact region below the n-type source region in the first substrate region.

* * * * *